(12) United States Patent
Skrenes et al.

(10) Patent No.: US 8,031,448 B2
(45) Date of Patent: Oct. 4, 2011

(54) INPUT VOLTAGE CLAMP FOR A SINGLE-SUPPLY SYSTEM

(75) Inventors: Lawrence Skrenes, Hartland, WI (US); David Maes, Cupertino, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 551 days.

(21) Appl. No.: 12/241,819

(22) Filed: Sep. 30, 2008

(65) Prior Publication Data

US 2009/0086395 A1    Apr. 2, 2009

Related U.S. Application Data

(60) Provisional application No. 60/976,737, filed on Oct. 1, 2007.

(51) Int. Cl.
*H02H 3/20* (2006.01)
*H02H 3/24* (2006.01)

(52) U.S. Cl. ............... 361/88; 361/91.2; 361/92; 361/90

(58) Field of Classification Search .................... 361/88, 361/91.2, 90, 92
See application file for complete search history.

(56) References Cited

U.S. PATENT DOCUMENTS

| 5,534,811 | A  | * | 7/1996  | Gist et al. ..................... 327/309 |
| 5,852,540 | A  |   | 12/1998 | Haider |
| 6,469,554 | B1 | * | 10/2002 | Harpham ..................... 327/157 |
| 2002/0101265 | A1 | | 8/2002 | Yuan |
| 2005/0168264 | A1 | | 8/2005 | Fukami |

FOREIGN PATENT DOCUMENTS

| EP | 1081859 A1 | * | 8/2000 |
| EP | 1 081 859 A1 | | 7/2001 |

* cited by examiner

*Primary Examiner* — Stephen W Jackson
*Assistant Examiner* — Angela Brooks
(74) *Attorney, Agent, or Firm* — North Weber & Baugh LLP

(57) ABSTRACT

A system, apparatus and a method are described that provide a voltage clamp for a single-supply system. In particular, a negative voltage clamp prevents a negative over-voltage in a system having only a positive independent voltage source. For example, certain analog-to-digital converters and other circuits allow input signals below the negative supply, or ground in single-supply systems, either by direct sampling or using input attenuation resistors. The negative clamp allows the circuit to provide accurate negative over-voltage protection and the absence of this claim would result in over-voltage protection in positive voltage directions only.

11 Claims, 3 Drawing Sheets

INPUT VOLTAGE CLAMP FOR A SINGLE-SUPPLY SYSTEM

CROSS REFERENCE TO RELATED PATENT APPLICATIONS

This application claims priority to U.S. Provisional Application Ser. No. 60/976,737, entitled "Negative Input Clamp without a Negative Supply Voltage," filed Oct. 1, 2007, which application is incorporated herein by reference in its entirety.

BACKGROUND

1. Field of the Invention

The present invention relates generally to the field of single-supply integrated chips, and more particularly to a voltage clamping device within a single voltage-supply system to protect against over-voltage scenarios.

2. Background of the Invention

Numerous electrical devices, circuits, components and systems are designed to operate at or below a certain maximum voltage or current threshold. If the voltage or current should exceed this threshold, the device may be damaged or otherwise function improperly. A typical cause of an over-voltage or over-current scenario is a supply voltage or reference voltage malfunctioning and providing a voltage that is too high. Typically, an electrical device, such as an electrical circuit, has a voltage rating that refers to this maximum voltage or current threshold and provides information on the circuit's voltage sensitivity.

Over-voltage protection is oftentimes employed within a circuit to prevent voltage or current being supplied that exceeds this maximum supply voltage threshold. Over-voltage protection is usually triggered when a voltage or current, above a safe threshold level, is supplied to a circuit. Effectively, the over-voltage protection either reduces the amount of voltage or current being delivered to the circuit or completely isolates the circuit from the voltage or current supply. This over-voltage protection also allows a circuit to operate in a desired voltage range while protecting the circuit from large voltage or current swings on a supply that would otherwise damage the circuit.

Currently, over-voltage protection circuits use external supply voltages as a reference and the inclusion of these supplies into a system and on an integrated circuit may be both expensive and complicated.

Several techniques are currently being employed to protect integrated chips from over-voltages by external sources. These techniques include current or voltage attenuation. For example, input attenuation resistors may be implemented within a voltage or current source path to protect circuits from over-voltage or over-current conditions. However, these attenuation resistors draw static current from the input source resulting in both inefficiencies within the circuit as well as introducing unwanted design parameters such as noise, linearity, gain and offset error.

Therefore, what is needed is a device and method that allows a reduction in the number of independent voltage or current sources for a circuit and that provides over-voltage protection therein.

SUMMARY OF THE INVENTION

A system, apparatus and a method are described that provide a voltage clamp for a single-supply system. In particular, a negative voltage clamp prevents a negative over-voltage in a system having only a positive independent voltage source. Certain analog-to-digital converters and other circuits allow input signals below the negative supply, or ground in single-supply systems, either by direct sampling or using input attenuation resistors. The negative voltage clamp allows the circuit to generate a negative reference voltage from a positive voltage source and uses that reference to ensure that the negative input voltage does not exceed the circuit's maximum voltage level threshold.

An over-voltage source circuit provides an external voltage input to an integrated circuit. A current limiting resistor, coupled to the external voltage input, is designed to protect the integrated circuit from voltages that exceed the maximum voltage level threshold of the integrated circuit by causing a voltage drop across the resistor. In various embodiments, the current limiting resistor may comprise an external current limiting resistor and/or an internal on-chip current limiting resistor.

A voltage clamp circuit, in shunt with the current limiting resistor, performs clamping on the input by transitioning from high impedance to low impedance when the input voltage to the integrated circuit exceeds a maximum voltage level threshold or reference either in the positive or negative direction. This threshold voltage is known as the trigger point wherein the clamp will shunt the input current to the positive supply thereby protected the sampling circuit from high voltage inputs.

In other various embodiments of the present invention, a negative voltage clamp is provided for a circuit only having an external positive voltage supply. As previously mentioned, a current limiting resistor is shunted by a clamp voltage detector and a clamp output gain device. A reference generator generates a reference voltage wherein a voltage inverting charge pump inverts the reference voltage around ground in the circuit. A clamp detector detects a negative voltage that exceeds a corresponding threshold voltage and, in response thereto, shunts current from the voltage node to the positive supply such that the negative voltage is clamped.

The reference voltage signal is generated within the clamp circuit that tracks the thermal, process and supply variations of the integrated circuit, resulting in an accurate negative clamp reference voltage mirroring the positive supply voltage. Using a bipolar transistor connected to this negative clamp reference voltage results in a negative clamp voltage that mirrors the positive clamp voltage resulting from a diode connected to the positive supply. As a result, a negative clamp threshold may be generated with a high level of accuracy from a positive supply or positive reference voltage, without the existence of an external negative supply or negative reference voltage.

Various embodiments of the present invention allow the implementation of a single positive supply voltage while sampling over positive and negative voltages. The present invention alleviates the common practice of implementing both a positive and negative input voltage supply. Thus, driver circuitry is simplified and a more reliable, cost-effective, and power saving solution is illustrated throughout this invention.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE INVENTION

A system, apparatus and a method are described that provide a voltage clamp for a single-supply system. In particular, a negative voltage clamp prevents a negative over-voltage in a system having only a positive independent voltage source. For example, certain analog-to-digital converters and other circuits allow input signals below the negative supply, or ground in single-supply systems, either by direct sampling or using input attenuation resistors. The negative clamp allows the circuit to provide accurate negative over-voltage protection and the absence of this claim would result in over-voltage protection in positive voltage directions only.

The following description is set forth for purpose of explanation in order to provide an understanding of the invention. However, it is apparent to one skilled in the art, that embodiments of the present invention, some of which are described below, may be incorporated into a number of different systems and devices. Structures and devices shown below in block diagram are illustrative of exemplary embodiments of the invention and are meant to avoid obscuring the invention.

Reference in the specification to "one embodiment", "in one embodiment" or "an embodiment" etc. means that a particular feature, structure, characteristic, or function described in connection with the embodiment is included in at least one embodiment of the invention. The appearances of the phrase "in one embodiment" in various places in the specification are not necessarily all referring to the same embodiment.

Figure 1:
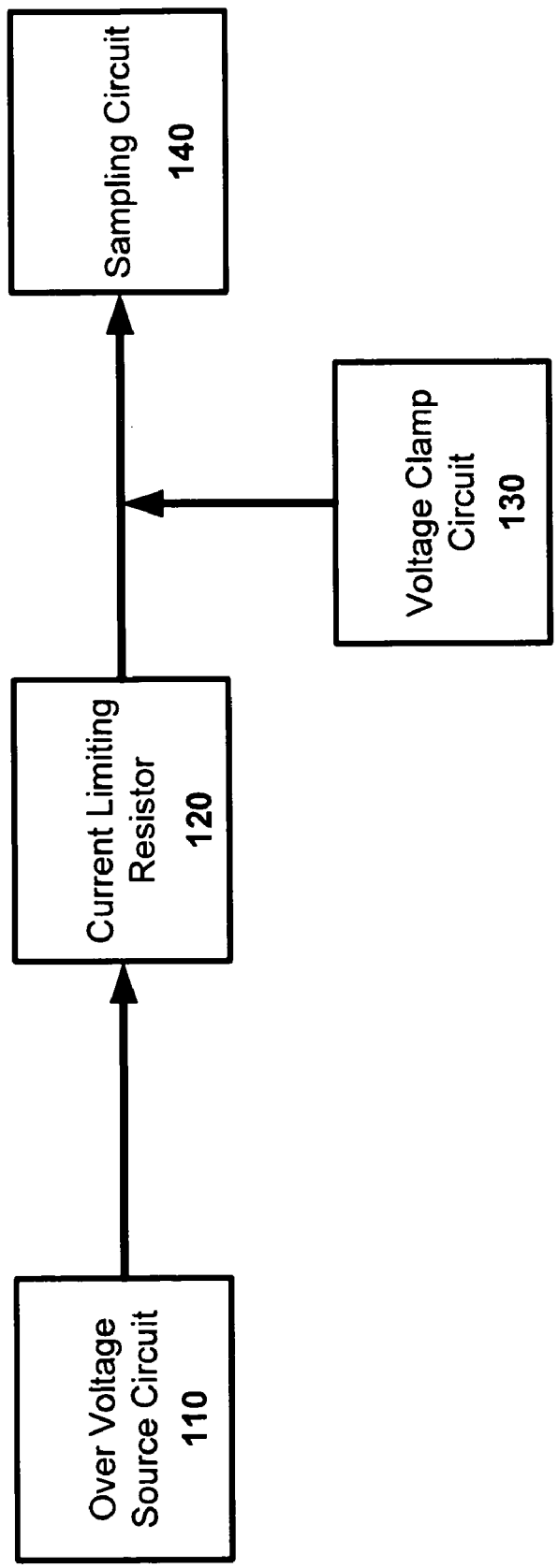
FIG. 1 illustrates a system for providing a clamp circuit according to various embodiments of the present invention.

FIG. 1 generally illustrates a single-supply sampling system that comprises a voltage clamp that protects against over-voltages in both the positive and negative directions according to various embodiments of the invention. An over-voltage source circuit 110 provides an external voltage input to an integrated circuit, the source circuit 110 providing a voltage level that exceeds the circuit's maximum voltage threshold. The over-voltage source circuit 110 may be any source that could potentially drive the voltage beyond the supply and potentially damage the input of the integrated circuit including, but not limited to, a charge source, transformer, voltage source, or current source.

A current limiting resistor 120, coupled to the external over-voltage source circuit 110, may include both on-chip and off-chip resistors to reduce the magnitude of voltage or current being supplied to the circuit. An external current limiting resistor may be employed to protect the integrated chip interface from significant large voltages being applied by the over-voltage source circuit 110. In certain embodiments, the current limiting resistor is determined based upon the external voltage being applied across the chip. For example, if an external voltage applied is 20V and the integrated chip clamps at 6 volts, then a drop of 14 volts across the resistor is required (20V−6V=14V). Therefore, if the current is limited to 20 mA, then the external resistance needed is simply 700Ω, as defined by Ohm's Law 14V/20 mA.

A voltage clamp circuit 130 is in shunt with the current limiting resistor 120. The voltage clamp circuit 130 performs clamping on the input by transitioning from a high impedance to a low impedance when the input voltage exceeds a particular voltage level. In certain embodiments of the invention, this voltage is known as the trigger point and causes the clamp to shunt the input current to primarily the positive supply. For example, if the trigger point is $+[V_{DD}+V_{diode}]$ wherein $V_{DD}=5V$ and $V_{diode}=0.7$, then the trigger point is equal to ±5.7V.

The sampling circuit 140 is connected to the current limiting resistor 120 and is protected from the high voltage input and sees at most ±5.7V. This sampling circuit 140 is intended to be one example of a circuit to which the clamp may be applied and one skilled in the art will recognize that numerous types of circuits may use this voltage clamp.

In another embodiment of the present invention, higher protection may be available on chip in the form of a higher resistor impedance, but in a preferred embodiment, a 60 ohm resistor is on-chip to allow low voltage high speed signals to perform at an optimal desirability and provide over-voltage protection without the need for an external resistor. Typically, higher voltage input systems operate at a slower speed and therefore the addition of an external resistor will minimally affect system performance.

Figure 2:
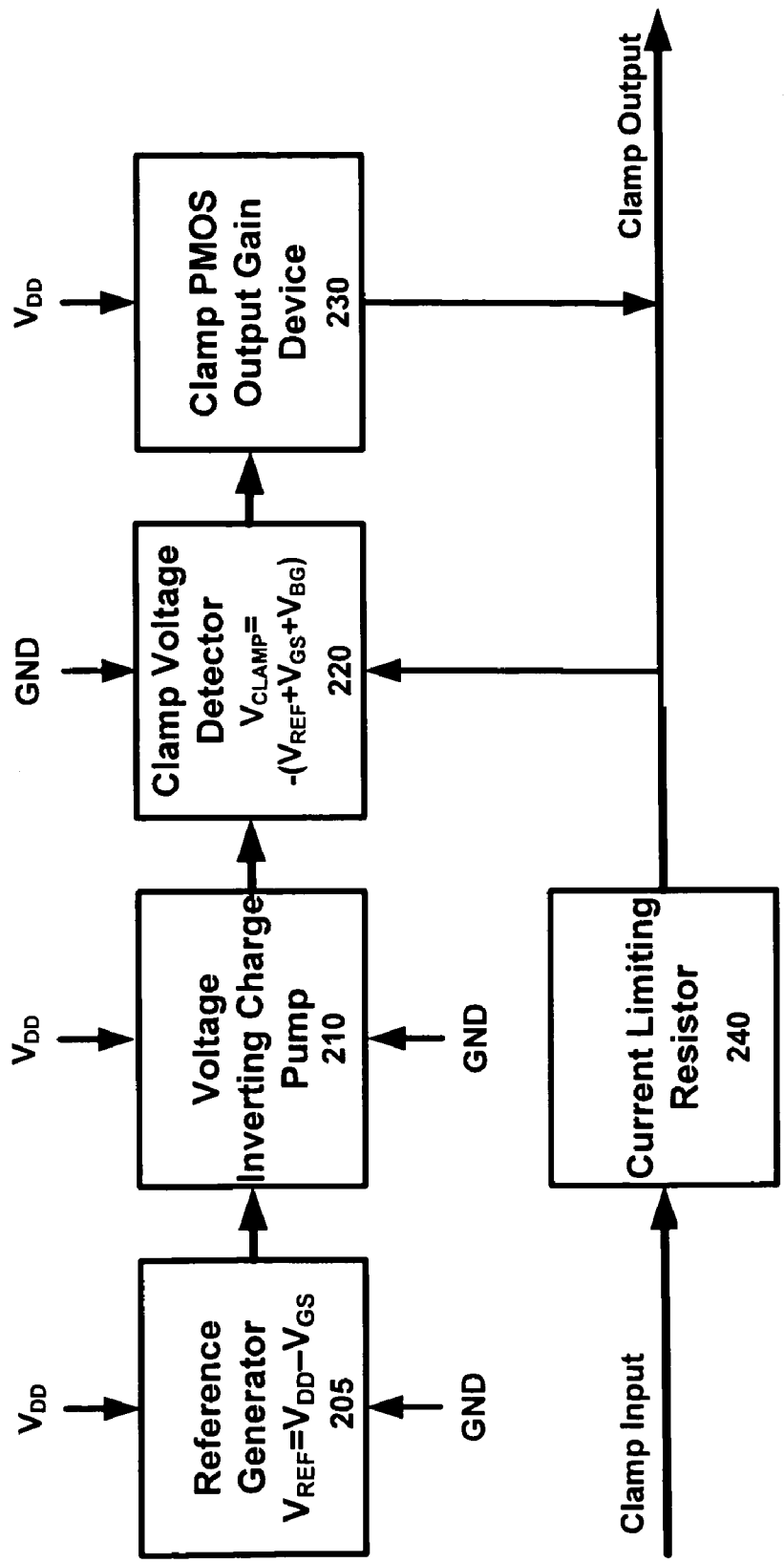
FIG. 2 illustrates a negative voltage clamp block diagram according to various embodiments of the present invention.

In yet another embodiment of the present invention, FIG. 2 illustrates a negative voltage clamp block diagram. The current limiting resistor 240 is in shunt with the clamp voltage detector 220 and clamp output gain device 230. The current limiting resistor 240 performs the same function as described in the aforementioned system level description. In essence, the current limiting resistor 240 provides internal and external over-voltage protection by including one or more resistors, either internally on a chip or external to the chip, which reduce the amount of voltage supplied on a particular chip input.

A reference generator 205 generates a voltage reference (hereinafter, "$V_{REF}$"), $V_{REF}=(V_{DD}-V_{GS})$, wherein $V_{DD}$ is the supply voltage and $V_{GS}$ is the gate-to-source voltage of an N-type metal oxide silicon ("NMOS") transistor with a given reference current flowing through it. In other embodiments, one skilled in the art will recognize that a reference voltage may be generated independent of the supply voltage. This positive reference, $V_{REF}$, generated by the reference generator 205, is inverted around GND by a voltage inverting charge pump 210 to create a negative reference voltage $-V_{REF}$. The reference generator 205 tracks the supply voltage as well as thermal and process variations of the circuit such that an accurate trigger point of the clamp is realized. One skilled in the art will recognize that these variations include variations caused by temperature changes and manufacturing processes of the wafer and supply voltage variations of the external supply.

The voltage inverting charge pump 210, coupled to the reference generator 205, inverts $V_{REF}$ into negative voltage. In various embodiments, a charge pump, voltage inverter is used which inverts $V_{REF}$ around ground. In certain examples, the negative voltage is equal to $-V_{REF}$ around ground in the circuit.

A clamp voltage detector 220 is coupled to voltage inverting charge pump 210 and detects a threshold voltage in which if the threshold voltage is exceeded, the clamp detector 220 will activate, sourcing current from GND to the output pad. The clamp voltage detector 220 threshold voltage is given by $V_{CLAMP}=-(V_{REF}+V_{GS}+V_{Forward\ Bias\ Diode})=-(V_{DD}+V_{Forward\ Bias\ Diode})$ wherein $V_{Forward\ Bias\ Diode}$ is the voltage across a forward bias diode.

In applications where higher clamp current is desired, a clamp PMOS output gain device 230 can be added to the output of the clamp detector 220, sourcing larger currents from the $V_{DD}$ supply. The addition of the PMOS output gain device also improved the clamp accuracy by increasing the open loop gain of the circuit.

Figure 3A:
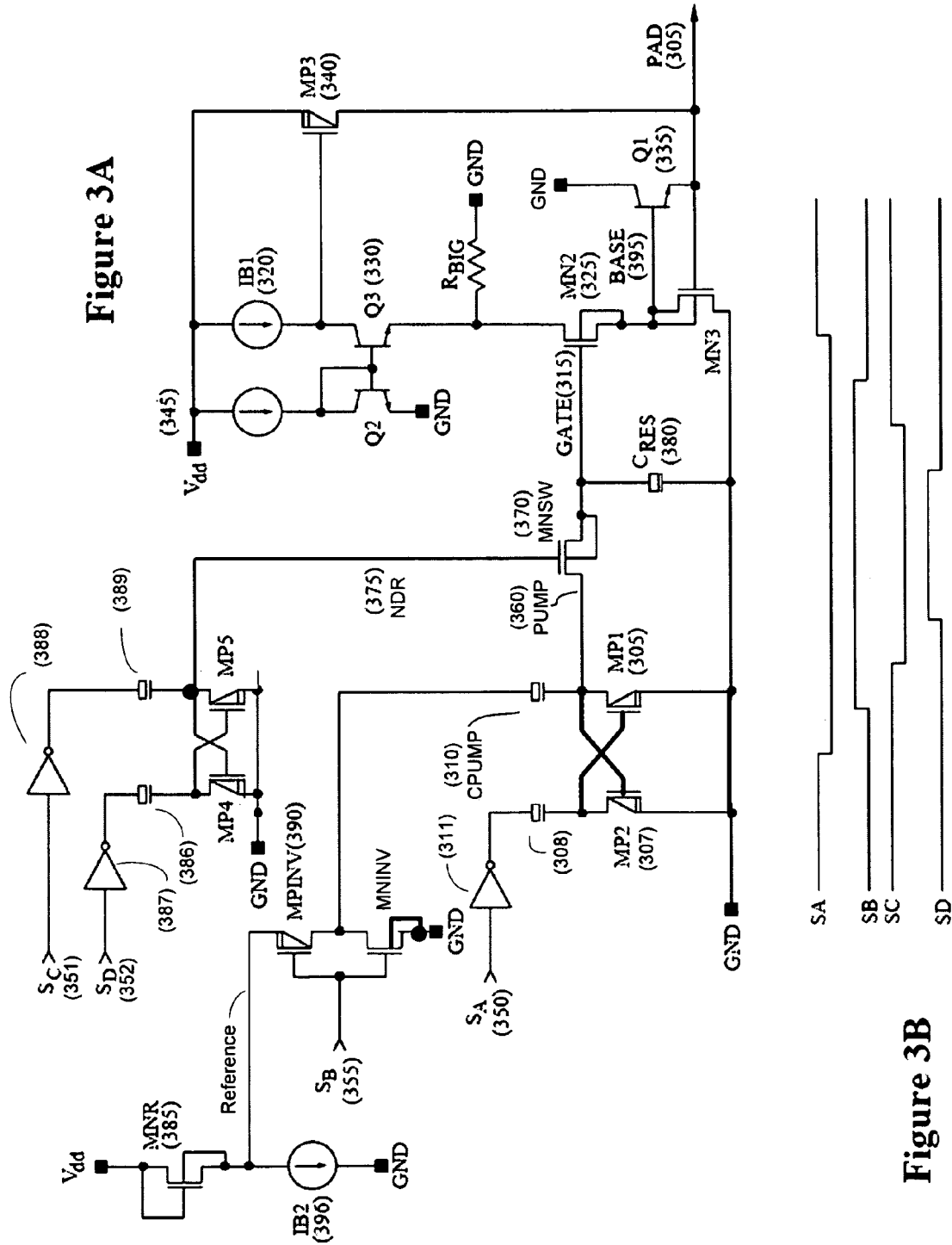
FIG. 3A illustrates a schematic of a circuit that provides an accurate negative clamp voltage according to various embodiments of the present invention.

In another more detailed embodiment of the present invention, FIG. 3A illustrates a schematic of a circuit that provides an accurate negative clamp voltage at the node, PAD 305 equal to $-(V_{DD}+V_{Forward\ Bias\ Diode})$ and which is partially derived from a positive supply voltage. In various embodiments of the invention, two charge pumps generate a voltage of $-(V_{DD}-V_{GS})$ at the node GATE 315. When the voltage at node PAD 305 is greater than $-(V_{DD}+V_{Forward\ Bias\ Diode})$, transistors, Q1 335, Q3 330, and MN2 325 are held in an off-state. A bias current source IB1 320 pulls the gate of MP3 340 to $V_{DD}$ keeping it an off-state.

When the voltage at PAD 305 is pulled below $-(V_{DD}+V_{Forward\ Bias\ Diode})$, Q1 335 is turned on and its base current flows through MN2 325 and Q3 330. When the current in Q3 330 exceeds IB1 320, MP3 340 will be pulled down and turned on. Most of the current pulling PAD 305 down will flow through MP3 340, only current IB1 320 will flow though MN2 325, and current $\beta_{Q1} \cdot IB1$ will flow through Q1 335. The clamp will operate correctly as long as the gate voltage at MP3 340 is not low enough that the base-collector junction of Q3 330 becomes forward-biased. The size of MP3 340 determines the amount of current the clamp can handle. Therefore, in certain embodiments of the invention, the clamp circuit is meant to be used when the input current is limited. For example, a series resistor can be placed between the driving circuit and PAD 305 to control the input current.

Two charge pumps create the voltage at GATE 315. A first charge pump comprises MP1 305, MP2 307, capacitor CPUMP 310, capacitor 308, inverter 311, and MPINV 390. A second charge pump comprises inverter 387, inverter 388, capacitor 386 and capacitor 389. The first charge pump, with control inputs SA 350 and SB 355 creates a negative voltage at node PUMP 360. When the control input SA 350 is in a high state and control input SB 355 is in a low state, transistor MP1 305 is turned on and node PUMP 360 goes to ground. The transistor MNSW 370 is kept in an off state by the second charge pump, which creates a voltage of $-V_{DD}$ at node NDR 375, which is the control the gate of MNSW 370.

When the control input SA 350 goes to a low state and control input SB 355 goes to a high state, the node PUMP 360 is pumped to a negative voltage. At the same time, node NDR 375 is pulled up to ground and MNSW 370 connects node GATE 315 and node PUMP 360. Any charge that may have leaked away from node GATE 315 reservoir capacitor $C_{RES}$ 380 is refreshed during this period.

In a pre-charge phase, the negative terminal of the capacitor $C_{Pump}$ 310 is connected to ground through MP1 305. The positive terminal of capacitor $C_{Pump}$ 310 is connected to the source of MNR 385 through MPINV 390. The voltage at the source of MNR 385 is a reference voltage given by $V_{DD}-V_{GS,MNR}$ and this voltage is impressed across capacitor CPUMP 310 during the precharge phase. In a charging phase, the reference voltage, $V_{DD}-V_{GS,MNR}$, is inverted around GND by the process such as one described in paragraphs 0034 and 0035, resulting in a negative reference voltage at the node GATE 315 given by $-(V_{DD}-V_{GS,MNR})$.

The second charge pump generates the gate control signal NDR 375 that drives the pass gate transistor MNSW 370. The voltage NDR 375 must be held to GND when pass transistor MNSW 370 is on (first charge pump's restoration phase) and $-V_{DD}$ when MNSW 370 is off (the first charge pump's pre-charge phase). NDR 375 will be held to GND when SC 351 is low and SD 352 is high. A pre-charge phase on the second charge pump would have ensured that capacitor 386 has a voltage of $V_{DD}$ across its terminals, resulting in the gate of MP5 being at $-V_{DD}$, keeping MP5 in a low impedance state when SC 351 is low and SD 352 is high. In this state, capacitor 389 is pre-charged. When SC 351 is high and SD 352 is low, the gate of MP5 is brought to GND and the NDR 375 node is drive to $-V_{DD}$, turning MNSW 370 off. During this phase, the voltage on capacitor 386 is regenerated to $V_{DD}$.

When PAD 305 is pulled below $-(V_{DD}+V_{BE,Q1})$, such as described in paragraphs 0033 to 0036 above, the voltage at node BASE 395 will be at $V_{GATE}-V_{GS,MN2}=-(V_{DD}-V_{GS,MNR})-V_{GS,MN2}$. If the currents of IB1 320 and IB2 396, and the sizes of MN2 325 and MNR 385 are chosen so the current densities of MN2 325 and MNR 385 are the same, then $V_{GS,MNR}=V_{GS,MN2}$. As a result, the voltage at node base 395 will be $-V_{DD}$ during the process of clamping an overvoltage. The PAD 305 will clamp at $-(V_{DD}+V_{BE,Q1})$ and this structure will mimic a diode clamp to a negative supply $-V_{DD}$ without the existence of the negative supply. This matching of current densities provides for an accurate negative clamping voltage, independent of the semiconductor process parameters, device temperature and supply voltage that closely matches a diode clamp in the positive direction caused by the forward bias source substrate junction of MP3 340.

Figure 3B:
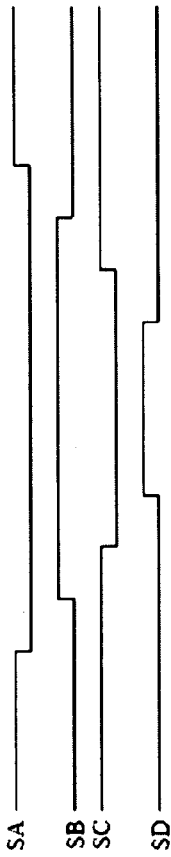
FIG. 3B illustrates control signals associated with a negative clamp voltage according to various embodiments of the present invention.

The charge pump is refreshed by regular toggling of control signals shown in FIG. 3B.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the appended claims.

What is claimed is:

1. A device for providing a negative voltage clamp to an integrated circuit, the device comprising:
    a reference generator that provides a positive reference voltage to a clamping circuit, a voltage level on the positive reference voltage being defined at least partially from a voltage supply and compensated thermal and process variations within the circuit;
    a voltage inverting charge pump, coupled to the reference generator, that inverts the reference voltage around ground and outputs a negative reference voltage;
    a clamp detector, coupled to the voltage inverting charge pump, that detects an input voltage having an absolute value above a reference voltage and activates a shunting current path in response thereto; and
    a current limiting resistor, coupled within the shunting current path, that reduces a voltage level at the input of the integrated circuit.

2. The device of claim 1 wherein the positive reference voltage provided by the reference generator is equal to the supply voltage minus a gate-to-source voltage of a transistor within the reference generator.

3. The device of claim 1 wherein the transistor is an N-type metal oxide silicon transistor with a given reference current.

4. The device of claim 1 wherein the current limiting resistor comprises an external or internal current limiting resistor to the integrated chip.

5. The device of claim 1 wherein the clamp detector transitions from a high impedance to a low impedance when the negative input voltage is less than the negative reference voltage.

6. The device of claim 1 further comprising a clamp PMOS output gain device that is coupled to the clamp detector and that increases loop gain and output drive to the clamp detector.

7. A clamping circuit for a single-supply system, the circuit comprising:
   a reference generator that is coupled to a supply voltage and that generates a reference voltage that at least partially compensates for thermal and process variations which cause errors in a trigger point voltage;
   a voltage inverting charge pump that inverts the reference voltage around ground resulting in an inverted reference voltage;
   a clamp voltage detector that is coupled to the reference voltage and the inverted reference voltage and that clamps an input voltage in response to the input voltage being above the reference voltage or below the inverted reference voltage; and
   a clamp output gain device that is coupled to the clamp voltage detector and increases the open loop gain and output drive of a voltage clamp.

8. The clamping circuit of claim 7 further comprising a current limiting resistor that is coupled in shunt with the clamp voltage detector and clamp output gain device, the current limiting resistor limiting a voltage applied to subsequently protected circuits.

9. The clamping circuit of claim 7 wherein the trigger point voltage is set to mirror around ground a positive diode drop above the supply voltage.

10. The clamping circuit of claim 7 wherein the trigger point voltage is generated by a voltage inverting charge pump, the input of which is a positive reference voltage related to the supply voltage.

11. The clamping circuit of claim 9 wherein the positive reference voltage compensates for temperature and process variations within the single-supply system.

* * * * *